(12) United States Patent
Choi et al.

(10) Patent No.: US 7,719,047 B2
(45) Date of Patent: May 18, 2010

(54) NON-VOLATILE MEMORY DEVICE AND FABRICATION METHOD THEREOF AND MEMORY APPARATUS INCLUDING THEREOF

(75) Inventors: Byoung Deog Choi, Suwon-si (KR); Jun Sin Yi, Suwon-si (KR); Sung Wook Jung, Suwon-si (KR); Sung Hyung Hwang, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 261 days.

(21) Appl. No.: 11/777,637

(22) Filed: Jul. 13, 2007

(65) Prior Publication Data

US 2008/0121887 A1    May 29, 2008

(51) Int. Cl.
*H01L 29/06*    (2006.01)
(52) U.S. Cl. .............. 257/314; 257/317; 257/315; 257/E21.662; 257/326; 257/E21.209
(58) Field of Classification Search ............ 257/314, 257/317, 315, E21.662, 326, E21.209
See application file for complete search history.

(56) References Cited

U.S. PATENT DOCUMENTS

2001/0007609 A1* 7/2001 Mizoguchi et al. .......... 386/111
2005/0026370 A1* 2/2005 Nuttall et al. ............... 438/265
2005/0233528 A1  10/2005 Shone
2006/0234393 A1  10/2006 Bhattacharyya
2006/0261401 A1* 11/2006 Bhattacharyya ............. 257/316

FOREIGN PATENT DOCUMENTS

| KR | 2000-32396 | 6/2000 |
| KR | 2001-92958 | 10/2001 |

OTHER PUBLICATIONS

Notice of Allowance issued by the Korean Intellectual Property Office on Sep. 30, 2008.

* cited by examiner

*Primary Examiner*—Davienne Monbleau
*Assistant Examiner*—Benjamin Tzu-Hung Liu
(74) *Attorney, Agent, or Firm*—Stein McEwen, LLP

(57) ABSTRACT

A non-volatile memory device is capable of reducing an excessive leakage current due to a rough surface of a polysilicon and of realizing improved blocking function by forming the first oxide film including a silicon oxy-nitride ($SiO_xN_y$) layer using nitrous oxide ($N_2O$) plasma, and by forming silicon-rich silicon nitride film, and a fabricating method thereof and a memory apparatus including the non-volatile memory device. Further, the non-volatile memory device can be fabricated on the glass substrate without using a high temperature process.

13 Claims, 6 Drawing Sheets

NON-VOLATILE MEMORY DEVICE AND FABRICATION METHOD THEREOF AND MEMORY APPARATUS INCLUDING THEREOF

CROSS-REFERENCE TO RELATED APPLICATIONS

This application claims the benefit of Korean Application No. 2006-117152, filed Nov. 24, 2006, in the Korean Intellectual Property Office, the disclosure of which is incorporated herein by reference.

BACKGROUND OF THE INVENTION

1. Field of the Invention

Aspect's of the present invention relate to a non-volatile memory device and a fabrication method. More specifically, aspects of the present invention relates to a non-volatile memory device formed on a glass substrate, and a method for fabricating a non-volatile memory device, and a memory apparatus including a non-volatile memory device.

2. Description of the Related Art

Generally, non-volatile memory devices may be classified into floating-gate memory devices and charge-trapping memory devices. A floating-gate memory device is a device that maintains a memory by using a potential well. A charge-trapping memory device is a device that maintains a memory by trapping charges in a trap region inside a nitride film or a trap region present in an interface between a nitride film and an insulator.

A representative form of the charge-trapping memory device is a device having a Silicon-Oxide-Nitride-Oxide-Silicon (SONOS) configuration. A typical SONOS configuration may include a sequential stack of a semiconductor substrate, an ONO configuration, and a gate electrode. The ONO configuration may include a sequential stack of a tunneling oxide film, a nitride film and a blocking oxide film. The tunneling oxide film tunnels electrons into a trap region inside the nitride film or a trap region at an interface of the nitride film. The blocking oxide film blocks charges from moving between the nitride film and the gate electrode. The trap region stores charges. Source/drain regions may be provided in the semiconductor substrate on either side of this stack.

Recently, the creation of a non-volatile memory device on a glass substrate has been investigated. Such a configuration may include a sequential stack of the glass substrate, the ONO configuration, and the gate electrode. The glass substrate may include a protective layer, e.g., a buffer oxide film, thereon to protect the glass substrate. A polysilicon layer may be provided on the protective layer. Source/drain regions may be provided in the polysilicon layer on either side of this stack.

Creation of the polysilicon layer may include crystallizing an amorphous polysilicon layer, e.g., by irradiating the amorphous polysilicon layer with a laser. Thus, surfaces of the polysilicon layers may be rough and non-uniform, which may result in a large leakage current being generated. In other words, a leakage current may be significantly increased due to the non-uniformity and roughness of the surfaces of the polysilicon layer. Therefore, such a non-volatile memory may function abnormally during programming/erasing operations.

SUMMARY OF THE INVENTION

Aspects of the present invention are therefore directed to a non-volatile memory device, a fabrication method therefore and a memory apparatus including the non-volatile memory device, which substantially overcome one or more of the problems due to the limitations and disadvantages of the related art.

Aspects of the present invention provide a non-volatile memory device on a glass substrate that is capable of reducing an excessive leakage current due to a rough surface of a polysilicon and of performing even at a low temperature process by forming the first oxide film including a silicon oxy-nitride ($SiO_xN_y$) layer using nitrous oxide ($N_2O$) plasma and by forming silicon-rich silicon nitride film, and a fabricating method thereof and a memory apparatus including the non-volatile memory device.

According to an aspect of the present invention, there is provided a non-volatile memory device including a buffer oxide film on a substrate, a polysilicon layer on the buffer oxide film, a first insulator including a sequential stack of a silicon oxy-nitride ($SiO_xN_y$) layer and a silicon dioxide ($SiO_2$) layer on the polysilicon layer, a silicon-rich silicon nitride film on the first insulator, a second insulator on the excessive silicon nitride film, a gate electrode on the second insulator, and a source and drain in the polysilicon layer.

According to another aspect of the present invention, there is provided a method of fabricating a non-volatile memory device, the method including forming a buffer oxide film on a substrate, forming a polysilicon layer on the buffer oxide film, forming a first insulator including a sequential stack of a silicon oxy-nitride ($SiO_xN_y$) layer and a silicon dioxide ($SiO_2$) layer on the polysilicon layer using nitrous oxide ($N_2O$) plasma, forming a silicon-rich silicon nitride film on the first insulator, forming a second insulator on the silicon-rich silicon nitride film, forming a gate electrode on the second insulator, and forming a source and drain by injecting impurity ions into an exposed region of the polysilicon layer.

According to another aspect of the present invention, there is provided, in a non-volatile memory apparatus, a field region defining an active region and a word line crossing the active region and the field region. The non-volatile memory apparatus includes a non-volatile memory device formed at a cross point of the word line and the active region. The non-volatile memory device also includes a buffer oxide film on a substrate, a polysilicon layer on the buffer oxide film, a first insulator including a sequential stack of a silicon oxy-nitride ($SiO_xN_y$) layer and a silicon dioxide ($SiO_2$) layer on the polysilicon layer, a silicon-rich silicon nitride film on the first insulator, a second insulator on the silicon-rich silicon nitride film, a gate electrode on the second insulator, and a source and drain formed in the polysilicon layer by injecting impurity ions into an exposed region of the polysilicon layer.

According to another aspect of the present invention, there is provided a flat panel display device including a power source section, a memory section, a program section, a buffer section, and a panel section. The memory section includes a non-volatile memory device. The non-volatile memory device also includes a buffer oxide film on a substrate, a polysilicon layer on the buffer oxide film, a first insulator including a sequential stack of a silicon oxy-nitride ($SiO_xN_y$) layer and a silicon dioxide ($SiO_2$) layer on the polysilicon layer, a silicon-rich silicon nitride film on the first insulator, a second insulator on the excessive silicon nitride film, a gate electrode on the second insulator, and a source and drain formed by injecting impurity ions into an exposed region of the polysilicon layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which

DETAILED DESCRIPTION OF THE EMBODIMENTS

Figure 1A:
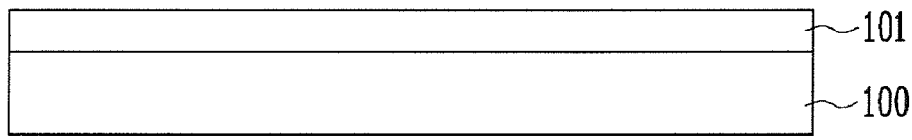
FIGS. 1A to FIG. 1H are cross-sectional views illustrating stages in a method of fabricating a non-volatile memory device according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Korean Patent Application No. 10-2006-0117152, filed on Nov. 24, 2006, in the Korean Intellectual Property Office, and entitled, "NON-VOLATILE MEMORY DEVICE AND FABRICATION METHOD THEREOF AND MEMORY APPARATUS INCLUDING THEREOF" is incorporated by reference herein in its entirety.

In the figures, the dimensions of layers and regions may be exaggerated for clarity of illustration. It should also be understood that when a layer or element is referred to as being "on" another layer or substrate, it can be directly on the other layer or substrate or intervening layers may also be present. Further, it will be understood that when a layer is referred to as being "under" another layer, it can be directly under, and one or more intervening layers may also be present.

In addition, it will also be understood that when a layer is referred to as being "between" two layers, it can be the only layer between the two layers, or one or more intervening layers may also be present. When one element is connected to another element, one element may be directly connected to the other element or may be indirectly connected to the other element via another element. Further, irrelevant elements are omitted for clarity. Also, like reference numerals refer to like elements throughout.

Figure 1B:
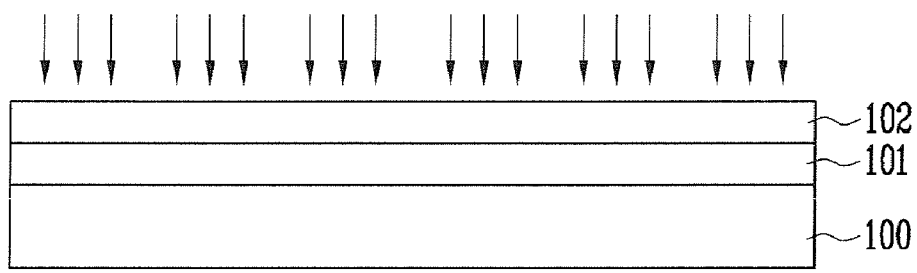
Figure 1C:
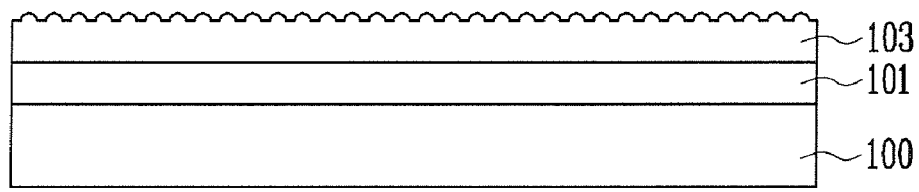
Figure 1D:
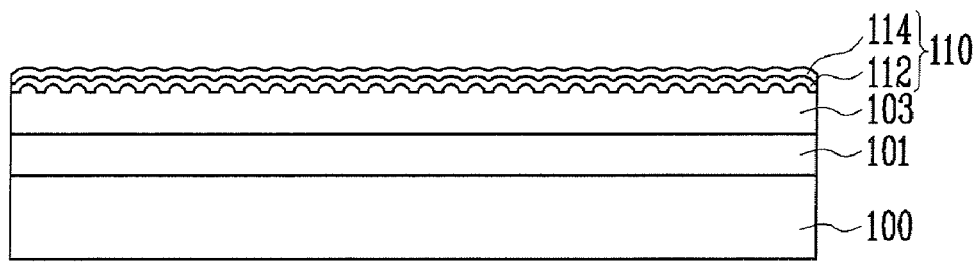
Figure 1E:
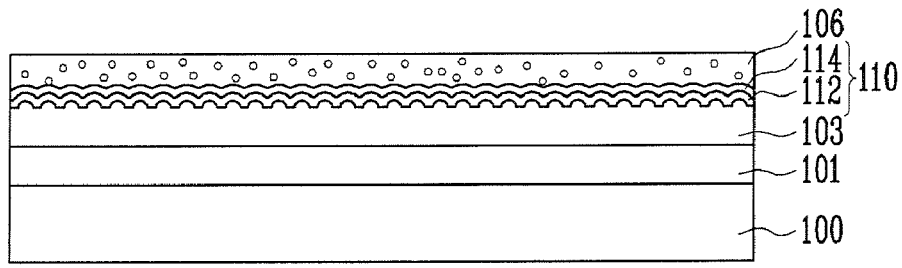
Figure 1F:
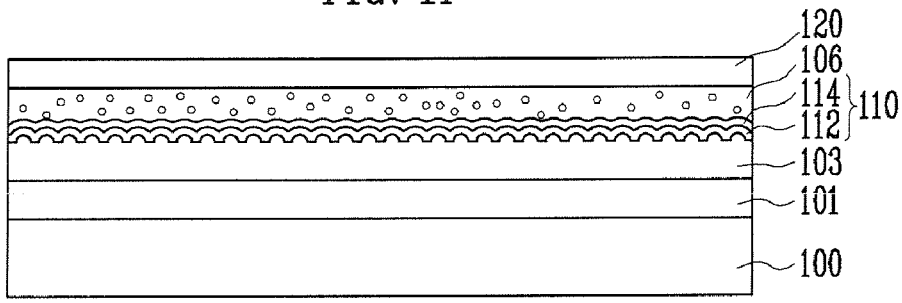
Figure 1G:
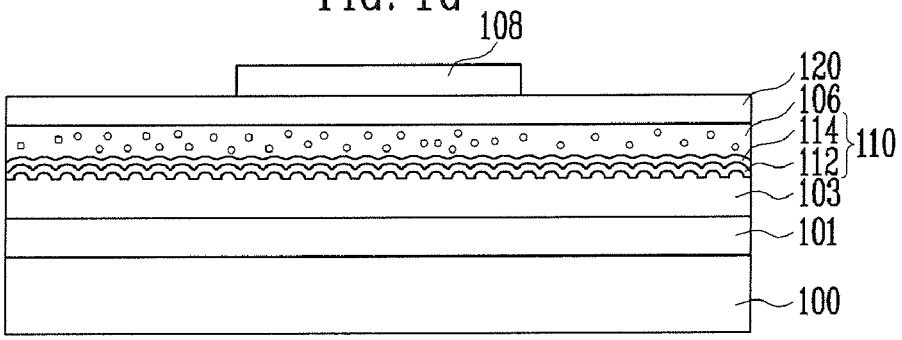
Figure 1H:
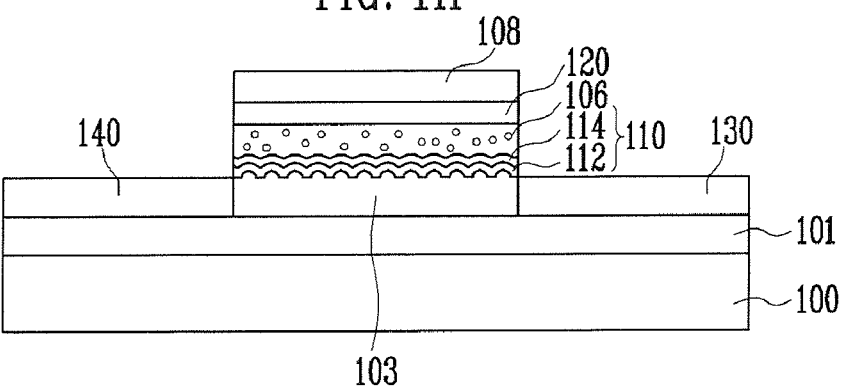

FIG. 1H is a cross-sectional view of a non-volatile memory in accordance with an embodiment of the present invention. As can be seen therein, the non-volatile memory may include a glass substrate 100, a buffer oxide film 101, a polysilicon layer 103, a first insulator 110 including a sequential stack of a $SiO_xN_y$ layer 112 and a $SiO_2$ layer 114, a silicon-rich silicon nitride film 106, a second insulator 120, an gate electrode 108, a source 130 and a drain 140. The first insulator 110 may serve as a tunneling oxide film, the nitride film 106 may serve as a trapping film, and the second insulator 120 may serve as a blocking oxide film FIGS. 1A to 1H are cross-sectional views of stages in a method for fabricating a non-volatile memory device according to an embodiment of the present invention.

First, as illustrated in FIG. 1A, the buffer oxide film 101 is deposited on the glass substrate 100, e.g., using a chemical vapor deposition (CVD) process. The buffer oxide film 101 may be formed thickly enough to block the migration of impurities between the glass substrate and the remainder of the non-volatile memory device. As a non-limiting example, the buffer oxide film 101 may have a thickness of approximately 3,000 Å.

Subsequently, as illustrated in FIG. 1B, an amorphous silicon layer 102 is deposited on the buffer oxide film 101, e.g., using a CVD process. As a non-limiting example, the amorphous silicon layer 102 may have a thickness of approximately 500-600 Å. The amorphous silicon layer 102 is irradiated with a laser beam, as shown in FIG. 1B.

A predetermined thickness of the amorphous silicon layer 102 is changed into the polysilicon layer 103 as a result of the irradiation, as shown in FIG. 1C. It is to be understood that part of the thickness of the amorphous silicon layer 102 may remain, i.e., both amorphous silicon layer and polysilicon may be present. However, for convenience, a single reference numeral "103" and the term "polysilicon layer" will be used hereinafter to designate the layer resulting from irradiation of the original amorphous silicon layer 102, regardless of whether the resulting layer is entirely polysilicon or is partially polysilicon and partially amorphous silicon. After the irradiation, the upper surface of the polysilicon layer 103f may be non-uniform. That is, the upper surface of the polysilicon layer 103 may be rough.

Next, the first insulator 110 is formed on the polysilicon layer 103 as shown in FIG. 1D. As noted above, the upper surface of the polysilicon layer 103 may be rough at the time that the first insulator is formed.

The first insulator 110, which may include a layer of silicon oxynitride ($SiO_xN_y$) 112 and a layer of silicon dioxide ($SiO_2$) 114, may be formed by an oxidative deposition process in an inductively coupled plasma CVD apparatus. The oxidative deposition process may be performed using a nitrous oxide ($N_2O$) plasma. The operation may be performed at a low temperature, e.g., about 500° C. or less.

As a non-limiting example, the $SiO_xN_y$ layer 112 may have a thickness of approximately 10 to 20 Å, e.g., approximately 15 Å and the $SiO_2$ layer 114 may have a thickness of approximately 10 to 25 Å, e.g., approximately 15 Å.

The $SiO_xN_y$ layer 112 and the $SiO_2$ layer 114 that make up the first insulator 110 may be formed sequentially using the same apparatus by reducing the concentration of nitrogen supplied to the apparatus during processing. For example, the concentration of nitrogen may be reduced from a higher concentration at the surface of the polysilicon layer 103 to a lower concentration at the upper surface of the first insulator 110 by varying a concentration of $N_2O$ plasma while carrying out the oxidation deposition process. In particular, the $N_2O$ plasma may be reduced to zero at some point in the process, in accordance with a desired thickness of the $SiO_xN_y$ layer 112. In other words, the $SiO_xN_y$ layer 112 formed on the surface of the polysilicon layer 103 may include a high concentration of nitrogen, while the $SiO_2$ 114 formed on the $SiO_xN_y$ layer 112 may have little or no nitrogen.

For example, the concentration of nitrogen may be higher at the early stage of the oxidation deposition process so that $Si_3N_4$ is formed at the surface of the polysilicon layer 103 at a very rapid rate. After the predetermined time, the concentration of nitrogen in the plasma may be reduced, e.g., by substituting oxygen for the nitrogen, while the insulation layer grows.

Accordingly, the first insulation layer 110 may be classified into the $SiO_xN_y$ layer 112 and the $SiO_2$ layer 114, based on the nitrogen concentration. For example, when an insulation layer is deposited in accordance with the above process to a thickness of 30 Å, the first 15 Å of the insulation layer 110, that is, the portion of the insulation layer 110 closest to the polysilicon layer 103 will the $SiO_xN_y$ layer 112, while the remainder of the insulation layer thicker will be the $SiO_2$ layer 114, particularly if the concentration of nitrogen in the plasma is controlled to be nearly zero at a thickness of 15 Å or more from the surface of the polysilicon layer 103. While it may be most efficient to form the $SiO_xN_y$ layer 112 and the $SiO_2$ layer 114 in the same apparatus and from the same insulation material, the layers 112 and 114 may be made from different materials and/or in different apparatuses. Further, while the nitrogen concentration may be controlled such that the layers 112 and 114 are clearly distinct, these layers may also have more of a gradient of nitrogen therethrough, such that the layers are non-distinct.

The formation of the $SiO_xN_y$ layer 112 and the $SiO_2$ layer 114 on the polysilicon layer 103 may reduce or eliminate abnormal functioning of the programming/erasing operations of the non-volatile memory, since a leakage current caused by the irregular surface characteristics of the polysilicon layer 103 may be reduced or eliminated.

Subsequently, as shown in FIG. 1E, the silicon-rich silicon nitride film 106 may be formed on the first insulator 110 using, e.g., an inductively coupled plasma CVD apparatus and using $SiH_4$ and $NH_3$ as $Si_xN_y$ deposition gases. In the deposition process, the flow amount of $SiH_4$ and $NH_3$ is regulated so that the amount of silicon in the silicon nitride film is in a stoichiometric excess in comparison to the amount of nitrogen. For example, the molar ratio of $SiH_4$ gas to $NH_3$ gas for depositing the $Si_xN_y$ thin film may be approximately 6:4 to 6:3.

When the flow rate of the gas is regulated so that the amount of silicon is excessive, the excessive silicon particles become coupled to each other to form amorphous silicon nanodots in the silicon-rich silicon nitride film 106. The formed amorphous silicon nanodots can function to store charges so that the charges can be trapped and stored in a trap region in the silicon-rich silicon nitride film 106, an interface trap region between the first insulation film 110 and the silicon-rich silicon nitride film 106, or an interface trap region between the silicon-rich silicon nitride film 106 and a second insulation film 120 (FIG. 3f).

The thickness of the silicon-rich silicon nitride film 106 can be approximately 50 to 350 Å and, as a non-limiting example, may be approximately 150 Å. Further, the size of the silicon nanodots can be regulated by regulating the relative flow amount of the $Si_xN_y$ deposition gases. The effect of the size of the silicon nanodot on photoluminescence will be explained in reference to FIG. 2.

Figure 2:
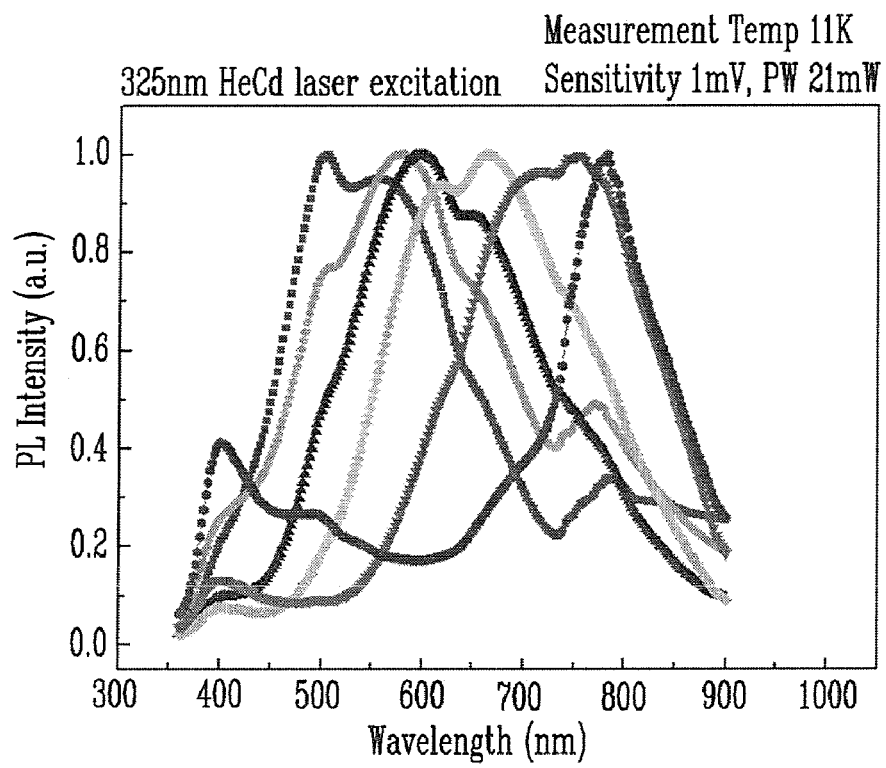
FIG. 2 is a graph showing photoluminescence peaks of various amorphous silicon nanodots in a nitride film.

FIG. 2 is a graph of photoluminescence peaks representing various sizes of amorphous silicone nanodots in a silicon nitride film.

Referring to FIG. 2, the x-axis represents the wavelength. A relatively short wavelength peak corresponds to relatively small amorphous silicon nanodots formed in the silicon nitride film and a relatively long wavelength peak corresponds to relatively large amorphous silicon nanodots formed in the silicon nitride film.

Further, the y-axis represents light emitting intensity of the amorphous silicon nanodots in the silicon nitride film. When the amorphous silicon nanodots are too small, the tunneling wall may be lowered by a large quantum restricting effect, thereby reducing the flat band voltage change width of a C-V curve showing the charge storing effect.

On the other hand, when the amorphous silicon nanodots are too large, the charge storing effect may be decreased because of bulk amorphous silicon characteristics.

In other words, it can be confirmed that the charge storing effect can be maximized by regulating the size of the amorphous silicon nanodots formed in the silicon-rich silicon nitride film using the data obtained through FIG. 2.

Subsequently, referring to FIG. 1F, the second insulator 120 is formed on the silicon-rich silicon nitride film 106 using, for example, an inductively coupled plasma CVD apparatus. As non-limiting examples, the second insulator 120 may have a thickness of approximately 50 to 200 Å, or more particularly approximately 85 Å.

The second insulation layer 120 functions as a blocking oxide film by blocking movement of charges between the silicon-rich silicon nitride film 106 having a charge trap region and the gate electrode 108 (described below) in a non-volatile memory formed on a glass substrate.

Subsequently, the gate electrode 108 as shown in FIG. 1G is formed by depositing and patterning a metal on the second insulator 120, followed by carrying out a lithographic and an etching process.

A source 130 and a drain 140 as shown in FIG. 1H are formed by carrying out a lithographic and an etching process to expose a portion of the polysilicon layer 103, and injecting impurity ions into the exposed polysilicon layer 103.

Figure 3:
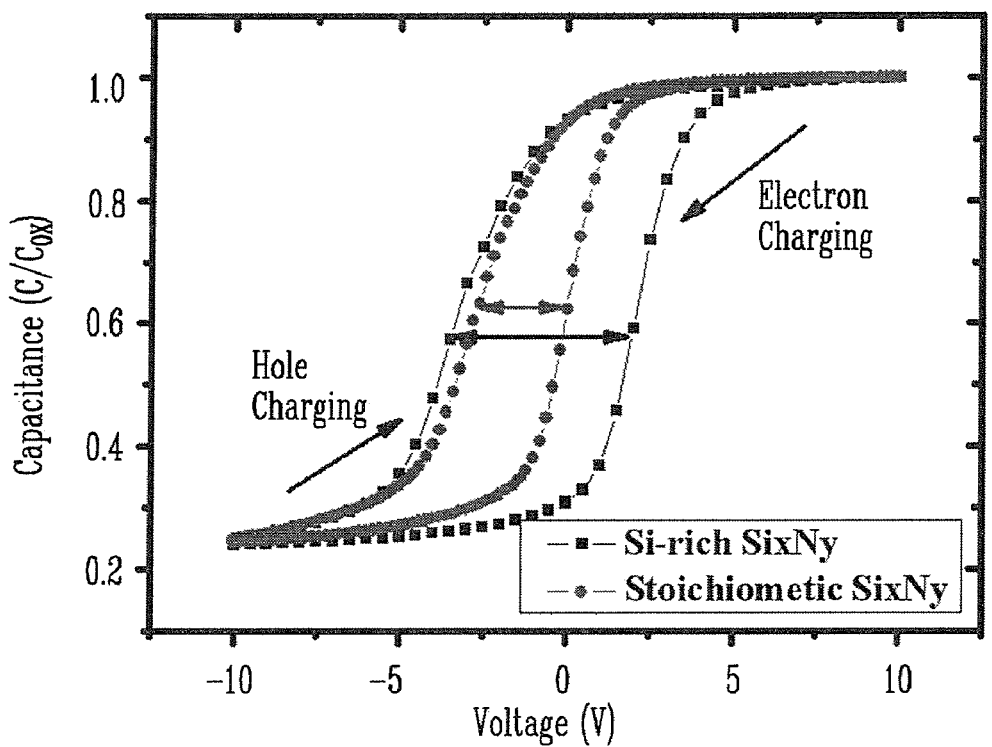
FIG. 3 is a diagram comparing the C-V characteristics of non-volatile memory devices having a conventional nitride film and a silicon-rich nitride film.

FIG. 3 is a diagram comparing the C-V characteristics of the non-volatile memory having a silicon-rich silicon nitride film and a stoichiometric silicon nitride film. In the formation of the silicon nitride films, the temperature of the substrate was 300 degrees Celsius and the RF power was 200 W. The silicon-rich silicon nitride film was formed by providing $SiH_4$ gas and $NH_3$ gas at a molar ratio of 6:4. More charges can be stored when the flat band voltage change width of the C-V hysteresis curve is larger, which is the case with the non-volatile memory formed with the silicon-rich silicon nitride film including amorphous silicon nanodots. Therefore, it can be confirmed that according to aspects of the present invention, the charge storing effect remarkably increases in comparison to a non-volatile memory formed with a conventional silicon nitride film.

The non-volatile memory apparatus can be realized using the non-volatile memory device explained in reference to FIG. 1H.

The non-volatile memory is an important memory component together with DRAMs (Dynamic Random Access Memory) and SRAMs (Static Random Access Memory). The non-volatile memory does not lose memorized information even when a power source is interrupted. By contrast, a volatile RAM (Random Access Memory) only temporarily memorizes data.

In particular, electrically erasable and programmable read only memories (EEPROMs) are considered as preferable among the nonvolatile memories, because EEPROMs are capable of programming and erasing data, and readily rewriting data. EEPROMs can be typically categorized as either bit erase memories capable of erasing and reading data in bits, or flash memories capable of erasing data in blocks of several tens to several hundred bytes, or more, and writing in bits. Because the bit erase memory may selectively erase and program data in bits, the bit erase memory is easily used and applied. However, the bit erase memory needs two transistors, i.e., a memory transistor and a selection transistor, therefore, a chip size is large, and the corresponding price is high. On the other hand, the flash memory is capable of programming data in bits, and erasing in bits, or in blocks. Since a memory cell of the flash memory includes one transistor, the area of the cell is relatively small.

The flash memories are typically classified into NOR-type and NAND-type architectures. In the NOR-type architecture, cells are disposed in parallel between a bit line and a ground. In the NAND-type architecture, cells are disposed in series between a bit line and a ground.

In the NOR-type architecture, floating gate memory cells of a memory array are arranged in a matrix. The gates of each floating gate memory cell of the array matrix are coupled by rows to word lines, and their drains are coupled to column bit lines. The source of each floating gate memory cell is typically coupled to a common source line. The NOR architecture floating gate memory array is accessed by a row decoder activating a row of floating gate memory cells by selecting the word line coupled to their gates. The row of selected memory cells couple stored data values on respective column bit lines by providing differing current characteristics between the coupled source line to the coupled column bit lines corresponding to a programmed state or unprogrammed state.

The NAND array architecture also arranges its array of floating gate memory cells in a matrix having the gates of each floating gate memory cell of the array coupled by rows to word lines. However, each memory cell is not directly coupled to a source line and a column bit line. Instead, the memory cells of the array are arranged together in "strings," typically of 16 to 32 memory cells each, where the memory cells in the string are coupled together in series between a common source line and a column bit line. The NAND architecture floating gate memory array is then accessed by a row decoder activating a row of floating gate memory cells by selecting the word select line coupled to their gates. In addition, the word lines coupled to the gates of the unselected memory cells of each string are also driven. However, the unselected memory cells of each string are typically driven by a higher gate voltage in order to operate them as pass transistors to allow them to pass current in a manner that is unrestricted by their respective stored data values. Under this condition, current flows from the source line to the column bit line through each floating gate memory cell of the series coupled string, restricted only by the memory cells of each string that are selected to be accessed. As a result, the current encoded stored data values of the row of selected memory cells are coupled to the column bit lines.

Figure 4A:
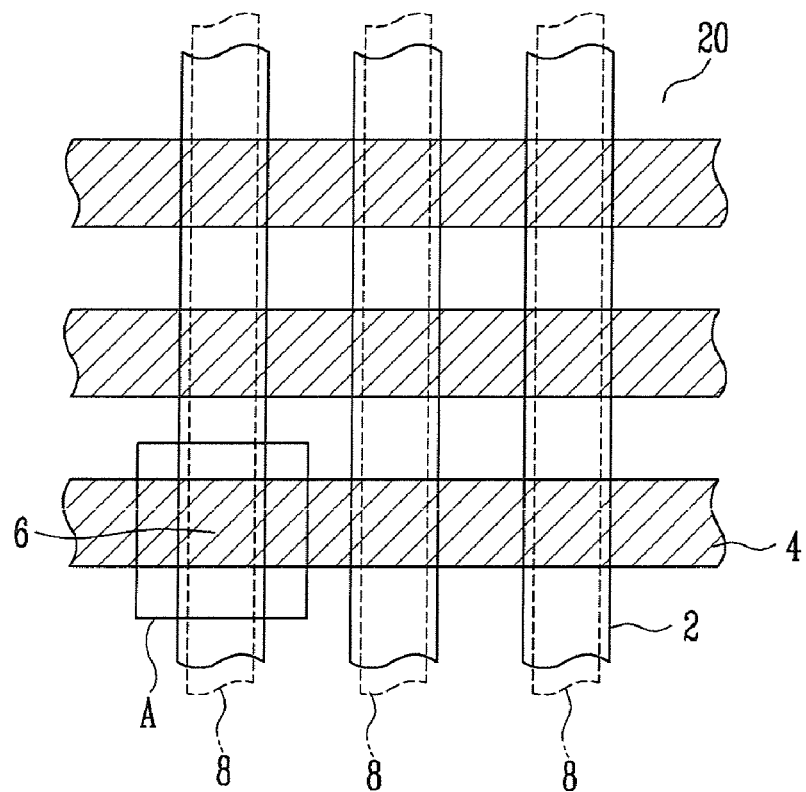
FIG. 4A is a plan view showing an NAND type non-volatile memory device.
Figure 4B:
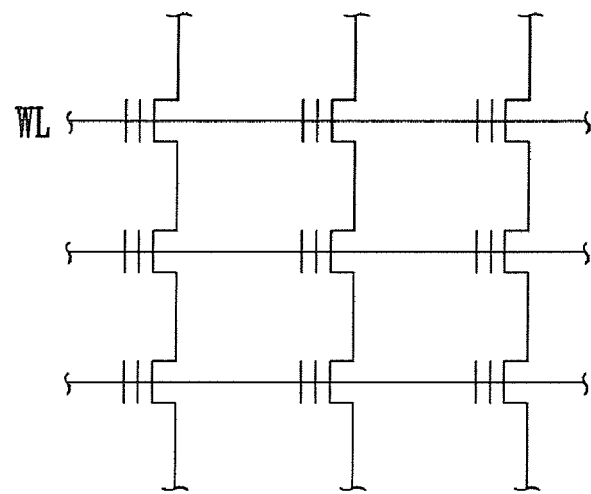
FIG. 4B is an equivalent circuit diagram of the device of FIG. 4A.

FIG. 4A is a plan view representing a non-volatile memory apparatus 20 having an NAND type structure. FIG. 4B is an equivalent circuit diagram.

Referring to FIG. 4A, the non-volatile memory apparatus 20 comprises at least one active region 2 and at least one word line 4. An active region can comprise a bit line 8. The non-volatile memory apparatus 20 further comprises at least one gate electrode 6, where a bit line 8 and a word line 4 cross one another. The non-volatile memory apparatus 20 includes a plurality of memory cells, one of which is shown in FIG. 4A by the reference designation A. The memory cell A can be a non-volatile memory device 20 as described with reference to FIG. 1H.

Figure 5A:
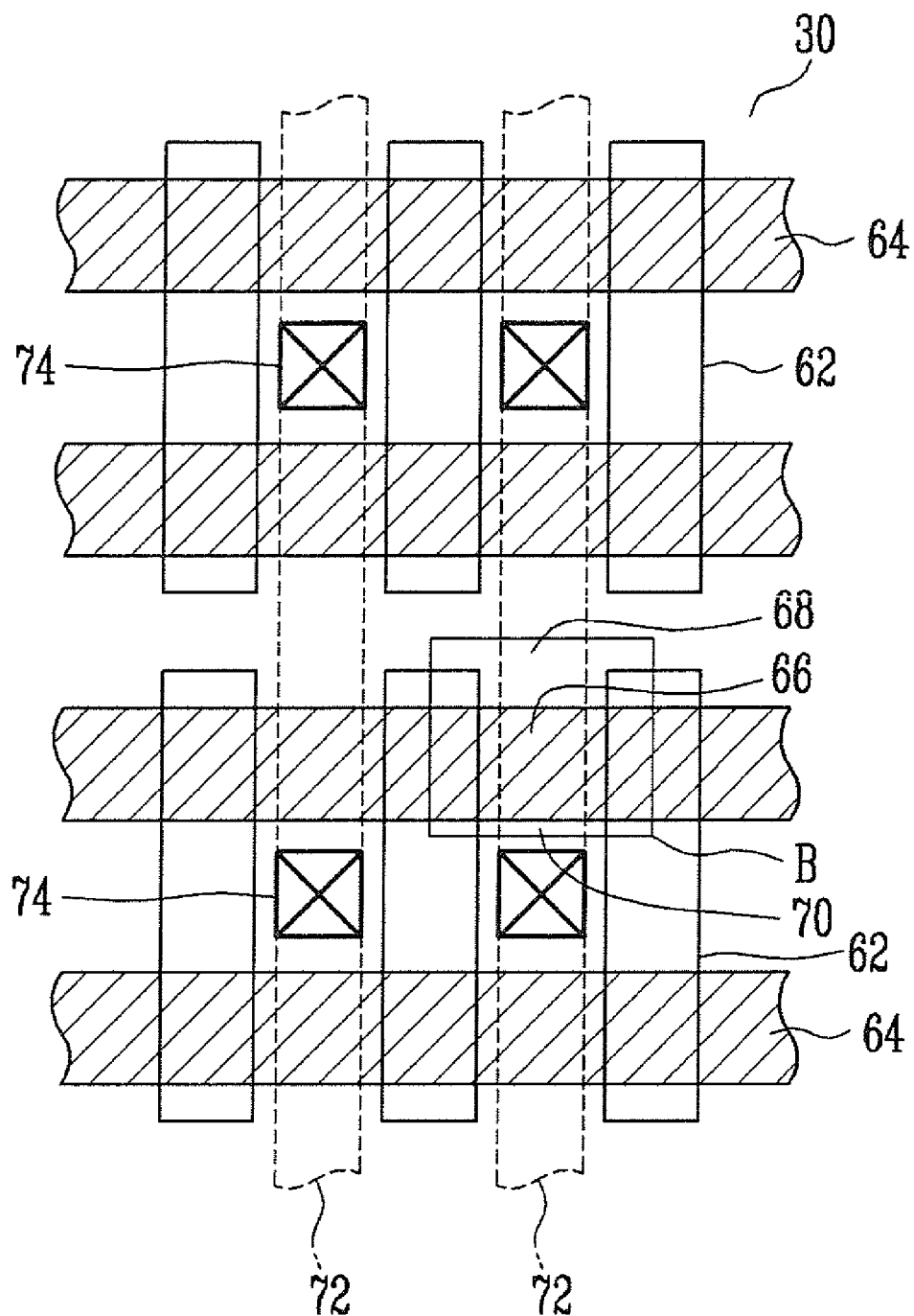
FIG. 5A is a plan view showing an NOR type non-volatile memory device.
Figure 5B:
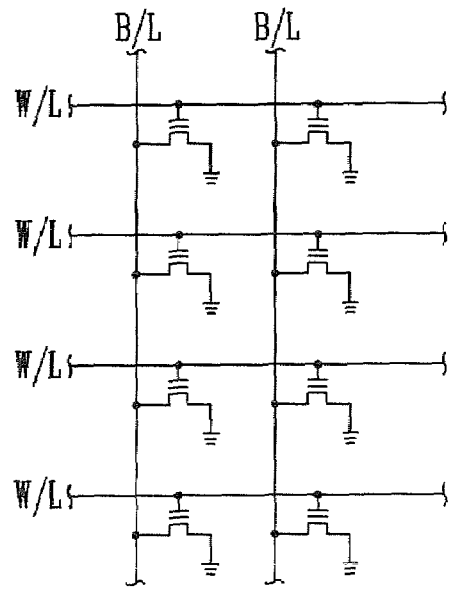
FIG. 5B is an equivalent circuit diagram of the device of FIG. 4A.

FIG. 5A is a plan view representing a non-volatile memory apparatus 30 having an NOR type structure. FIG. 5B is an equivalent circuit diagram.

Referring to FIG. 5, the non-volatile memory apparatus includes word lines 64, bit lines 72 and field regions 62. The field regions 62 define the boundaries of an active region. The word lines 64 cross the active region and the field region 62. Gate electrodes 66 are disposed where the word line 64 crosses the active region 80. Source regions 68 and drain regions 70 are formed on active regions at respective sides of the gate electrode 66 by ion-implanting impurities. Contacts 74 are formed adjacent to the drain regions 70. The bit lines 72 are formed orthogonally to the word lines 64 in the drain region 70. The non-volatile memory apparatus includes a plurality of memory cells, one of which is shown by the reference designation B. The memory cell B can be the non-volatile memory device 30 as described with reference to FIG. 1H.

Functionally, the random reading speed of the NAND type array is slower than that of the NOR type array, and there is a limit to the ability of a plurality of cells connected in series to the NAND type cell array to write and erase data in one group.

On the other hand, since the NAND type array can have a small cell area, the cost per bit thereof is lower. It is because the structure of the cell can reduce the area occupied by a contact per one bit.

Further, the non-volatile memory device as described herein can be included in a flat panel display device such as an organic light emitting display device.

Figure 6:
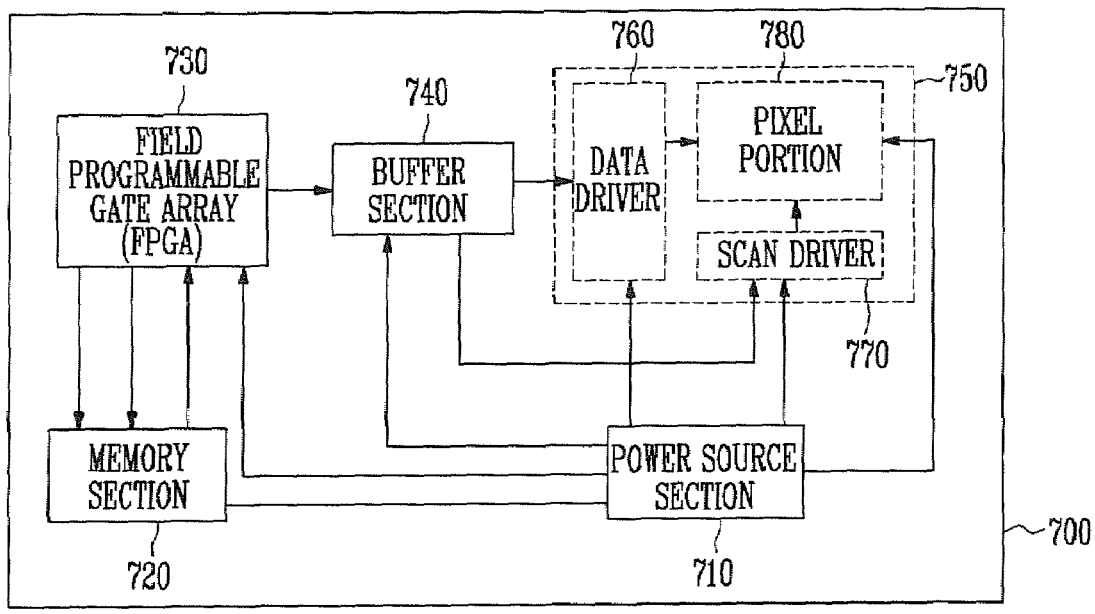
FIG. 6 is a block diagram showing a flat panel display device according to an embodiment of the present invention.

FIG. 6 is a block diagram showing the constitution of a flat panel display device according to an embodiment of the present invention.

In FIG. 6, although an organic light emitting display device is described as an example of a flat panel display device, the flat panel display device according to an embodiment of the present invention is not limited to the organic light emitting display device.

Referring to FIG. 6, the organic light emitting display device 700 according to an embodiment of the present invention includes a power source section 710, a memory section 720, a program section 730, which can be a field programmable gate array (FPGA), a buffer section 740, and a panel section 750.

First, the power source section 710 receives electrical power from a power source, steps down the voltage and transfers the stepped down power to various components of the display device 700. In particular, the power source section 710 varies the power source voltage and transfer the voltage to the built-in circuit sections, including the memory section 720, the field programmable gate array 730, the buffer section 740, and a panel section 750, i.e., the built circuit section.

As used herein, the term "built-in circuit section" refers generally to the memory section 720, the field programmable gate array 730, the buffer section 740, and the panel section 750, and also includes the power source section 710.

The memory section 720 may be embodied by a non-volatile memory according to FIGS. 4 or 5, and the memory device constituting the memory section may be the non-volatile memory device as shown in FIG. 1H.

Data stored in the memory section 720 is promptly transferred to the field programmable field array 730. The field programmable gate array 730 receives data from the memory section 720 according to a logic program disposed therein and transfers a command signal and an address signal to the memory section 720. For example, the memory section 720 designates an address of the memory section 720 according to the command signal and the address signal and outputs the data corresponding to the address to the field programmable gate array 730.

Thereafter, the data received in the field programmable gate array 730 is converted to a program signal and a control signal by the logic program and is transferred to the buffer section 740.

Here, the control signal controls the program signal operating an organic light emitting device of the panel section.

Further, the buffer section 740 includes a memory that stores temporary information. The buffer section 740 compensates for differences of time and differences of information flow speeds generated when information is transmitted from one unit to another unit.

The panel section 750 includes a pixel portion 780, a data driving section 760, and a scan driving section 770. The pixel portion 780 includes an organic light emitting device. The panel section 750 receives a program signal and a control signal from the buffer section 740 and the organic light emitting device emits light.

As described above, excessive current leakage in a non-volatile memory device caused by the surface non-uniformity and roughness of a polysilicon layer formed by laser irradiation of amorphous silicon can be reduced by forming a first insulator comprising a silicon oxynitride film and a silicon dioxide film over the polysilicon layer. The non-volatile memory device can be fabricated on a glass substrate by a low temperature process, by forming the first insulator using a nitrous oxide plasma and by forming a silicon-rich silicon nitride film over the first insulator using formation gases having an excess molar amount of silicon.

In other words, since the non-volatile memory device can be fabricated on the glass substrate even without using a high temperature process, the present invention can be applied to a flat panel display device.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A non-volatile memory device comprising:
   a buffer oxide film on a substrate;
   a polysilicon layer on the buffer oxide film;
   a first insulator including a sequential stack of a silicon oxy-nitride ($SiO_xN_y$) layer and a silicon dioxide ($SiO_2$) layer on the polysilicon layer;
   a silicon-rich silicon nitride film on the first insulator;
   a second insulator on the silicon-rich silicon nitride film;
   a gate electrode on the second insulator; and
   a source and drain in the polysilicon layer,
   wherein the silicon oxy-nitride ($SiO_xN_y$) layer is formed directly on the polysilicon layer and the silicon dioxide ($SiO_2$) layer is formed directly on the silicon oxy-nitride ($SiO_xN_y$) layer and contacts the silicon-rich silicon nitride film.

2. The non-volatile memory device as claimed in claim 1, wherein the silicon-rich silicon nitride film includes amorphous silicon nanodots.

3. The non-volatile memory device as claimed in claim 1, wherein the silicon-rich silicon nitride film is formed by supplying $Si_xN_y$ deposition gases to an inductively coupled plasma CVD apparatus, wherein the $Si_xN_y$ deposition gases include a silicon-containing deposition gas that is supplied in an excess molar amount.

4. The non-volatile memory device as claimed in claim 3, wherein the $S_ixN_y$ deposition gases are $SiH_4$ and $NH_3$ and wherein the molar ratio of the $SiH_4$ gas to the $NH_3$ gas is 6:4 to 6:3.

5. The non-volatile memory device as claimed in claim 1, wherein the silicon-rich silicon nitride film is approximately 50 to 350 Å thick.

6. The non-volatile memory device as claimed in claim 1, wherein the $SiO_xN_y$ layer and the $SiO_2$ layer are formed by oxidation using a nitrous oxide plasma in an inductively coupled plasma CVD apparatus.

7. The non-volatile memory device as claimed in claim 1, wherein the $SiO_xN_y$ layer of the first insulator is approximately 10 to 20 Å thick.

8. The non-volatile memory device as claimed in claim 1, wherein the $SiO_2$ layer of the first insulator is approximately 10 to 25 Å thick.

9. A non-volatile memory apparatus comprising:
   a field region defining an active region;
   a word line crossing the active region and the field region; and
   a non-volatile memory device formed at a cross point of the word line and the active region,
   wherein the non-volatile memory device comprises:
   a buffer oxide film on a substrate;
   a polysilicon layer on the buffer oxide film;
   a first insulator including a sequential stack of a silicon oxy-nitride ($SiO_xN_y$) layer and a silicon dioxide ($SiO_2$) layer on the polysilicon layer;
   a silicon-rich silicon nitride film on the first insulator;
   a second insulator on the silicon-rich silicon nitride film;
   a gate electrode on the second insulator; and
   a source and a drain formed in the polysilicon layer by injecting impurity ions into an exposed region of the polysilicon layer,
   wherein the silicon oxy-nitride ($SiO_xN_y$) layer is formed directly on the polysilicon layer and the silicon dioxide ($SiO_2$) layer is formed directly on the silicon oxy-nitride ($SiO_xN_y$) layer and contacts the silicon-rich silicon nitride film.

10. The non-volatile memory apparatus as claimed in claim 9, wherein the silicon-rich silicon nitride film includes amorphous silicon nanodots.

11. The non-volatile memory apparatus as claimed in claim 9, wherein the non-volatile memory apparatus has an NAND type structure or an NOR type structure.

12. A flat panel display device comprising:
    a power source section,
    a memory section,
    a program section,
    a buffer section, and
    a panel section,
    wherein the memory section includes a non-volatile memory device comprising;
    a buffer oxide film on a substrate;
    a polysilicon layer on the buffer oxide film;
    a first insulator including a sequential stack of a silicon oxy-nitride ($SiO_xN_y$) layer and a silicon dioxide ($SiO_2$) on the polysilicon layer;
    an excessive silicon nitride film on the first insulator;
    a second insulator on the excessive silicon nitride film;
    a gate electrode on the second insulator; and
    a source/drain in the polysilicon layer by injecting impurity ions into an exposed region of the polysilicon layer,
    wherein the silicon oxy-nitride ($SiO_xN_y$) layer is formed directly on the polysilicon layer and the silicon dioxide ($SiO_2$) layer is formed directly on the silicon oxy-nitride ($SiO_xN_y$) layer and contacts the silicon-rich silicon nitride film.

13. The flat panel display device as claimed in claim 12, wherein the silicon-rich silicon nitride film includes amorphous silicon nanodots.

* * * * *

UNITED STATES PATENT AND TRADEMARK OFFICE
CERTIFICATE OF CORRECTION

PATENT NO. : 7,719,047 B2 Page 1 of 1
APPLICATION NO. : 11/777637
DATED : May 18, 2010
INVENTOR(S) : Byoung Deog Choi et al.

It is certified that error appears in the above-identified patent and that said Letters Patent is hereby corrected as shown below:

Title Page, insert:

--(30) Foreign Application Priority Data
Nov. 24, 2006    (KR) ............. 2006-117152--.

Column 10, line 27, change "(SiO,)" to --(SiO$_2$)--.

Signed and Sealed this

Thirty-first Day of August, 2010

David J. Kappos
*Director of the United States Patent and Trademark Office*